United States Patent [19]

Ellis et al.

[11] Patent Number: 5,384,238

[45] Date of Patent: Jan. 24, 1995

[54] POSITIVE-ACTING PHOTOTHERMOGRAPHIC MATERIALS

[75] Inventors: Richard J. Ellis, Great Dunmow; Ranjan C. Patel, Little Hallingbury; Robert J. D. Nairne, Pinnacles, all of Great Britain

[73] Assignee: Minnesota Mining and Manufacturing Company, St. Paul, Minn.

[21] Appl. No.: 185,327

[22] Filed: Jan. 21, 1994

Related U.S. Application Data

[63] Continuation of Ser. No. 948,641, Sep. 23, 1992, abandoned.

[30] Foreign Application Priority Data

Oct. 14, 1991 [GB] United Kingdom ............... 9121789

[51] Int. Cl.⁶ ............................................. G03L 1/498
[52] U.S. Cl. ..................... 430/617; 430/202; 430/203; 430/264; 430/271; 430/273; 430/915; 430/916
[58] Field of Search ............... 430/202, 203, 264, 271, 430/273, 915, 617, 916

[56] References Cited

U.S. PATENT DOCUMENTS

| | | | |
|---|---|---|---|
| 3,589,901 | 6/1971 | Lyons | 96/64 |
| 4,075,017 | 2/1978 | Goffe et al. | 96/48 HD |
| 4,124,387 | 11/1978 | Kohrt | 96/29 D |
| 4,547,450 | 10/1985 | Maeda et al. | 430/203 |
| 4,587,198 | 5/1986 | Fisch | 430/201 |
| 4,753,862 | 6/1988 | Sato et al. | 430/138 |
| 4,761,360 | 8/1988 | Sato et al. | 430/138 |
| 4,772,541 | 9/1988 | Gottschalk et al. | 430/339 |
| 4,800,149 | 1/1989 | Gottschalk et al. | 430/138 |
| 4,814,252 | 3/1989 | Tamagawa et al. | 430/138 |
| 4,865,942 | 9/1989 | Gottschalk et al. | 430/138 |
| 4,924,009 | 5/1990 | Neckers et al. | 549/223 |
| 5,001,032 | 3/1991 | Kayayama et al. | 430/203 |

FOREIGN PATENT DOCUMENTS

| | | |
|---|---|---|
| 223587 | 11/1986 | European Pat. Off. . |
| 301539 | 7/1988 | European Pat. Off. . |
| 320020 | 12/1988 | European Pat. Off. . |
| 331413 | 2/1989 | European Pat. Off. . |
| 362827 | 4/1989 | European Pat. Off. . |
| 444786 | 2/1991 | European Pat. Off. . |
| 53-144322 | 1/1976 | Japan . |
| 51-051933 | 7/1976 | Japan . |
| 53-120520 | 10/1978 | Japan . |
| 57-089750 | 6/1982 | Japan . |
| 57-101832 | 6/1982 | Japan . |
| 58-040543 | 3/1983 | Japan . |
| 58-40544 | 3/1983 | Japan . |
| 60-030931 | 7/1985 | Japan . |
| 61-022841 | 1/1986 | Japan . |
| 61-107243 | 5/1986 | Japan . |
| 61-183460 | 8/1986 | Japan . |
| 61-188535 | 8/1986 | Japan . |
| 62-187837 | 8/1987 | Japan . |
| 62-187842 | 8/1987 | Japan . |
| 63-34536 | 2/1988 | Japan . |
| 1156933 | 8/1966 | United Kingdom . |
| 1172425 | 2/1967 | United Kingdom . |
| 1507829 | 5/1974 | United Kingdom . |
| 2022277 | 5/1979 | United Kingdom . |
| 2195463 | 8/1987 | United Kingdom . |

Primary Examiner—Thorl Chea
Attorney, Agent, or Firm—Gary L. Griswold; Walter N. Kirn; Gregory A. Evearitt

[57] ABSTRACT

Positive-acting photothermographic elements suitable for use at contact speeds comprising a base layer having at least two layers thereon, which layers define a photosensitive medium comprising a photocurable composition, a reducible silver source, and a reducing system for silver ion comprising one or more components including a compound capable of reducing silver ion to silver metal, such that the reducible silver source and at least one component of the reducing system for silver ion are present in separate layers, wherein exposure of the element to actinic radiation causes curing of the photocurable composition in the exposed area(s), said curing preventing the reducing system from interacting with the reducible silver source during thermal processing and in which the photocurable composition comprises a free radical curable resin and a photoinitiator therefor having an absorbance to radiation in the wavelength range of 340 to 440 nm, which photoinitiator upon exposure to said actinic radiation or during subsequent thermal processing undergoes a loss of absorption in said wavelength range 340 to 440 nm.

14 Claims, 8 Drawing Sheets

POSITIVE-ACTING PHOTOTHERMOGRAPHIC MATERIALS

This is a continuation of application Ser. No. 07/948,641 filed Sep. 23, 1992, now abandoned.

FIELD OF THE INVENTION

This invention relates to positive-acting photothermographic materials and in particular, to black and white, positive-acting photothermographic media which are suitable for use at contact speeds.

BACKGROUND TO THE INVENTION

There is a growing need for a range of positive-acting imaging materials able to complement those provided by negative-acting Dry Silver systems, particularly for use in graphic arts and medical imaging. For such uses, prospective imaging materials should desirably exhibit the following characteristics:
  (i) contact ($10^5$ to $10^3$ ergs/cm$^2$) or higher speeds;
  (ii) visible through to near infrared (VIS-NIR) spectral sensitisation for higher speed materials;
  (iii) imaged areas should be transparent to ultraviolet through to visible light (UV-VIS) (340 to 700 nm) so that the exposed film can be used for subsequent contact applications in a printing process;
  (iv) dry processing, preferably using standard Dry Silver processing conditions, and
  (v) be image stable, for subsequent contact exposure.

The prior art has long sought to provide suitable positive-acting photothermographic materials, examples of which are disclosed by: British Patent Nos. 1156933, 1172425, 1507829 and 2022277; European Patent No. 320020; U.S. Pat. Nos. 3,589,901, 4,075,017, 4,124,387 and 4,587,198, and Japanese Patent Nos. 53-120520, 57-089750, 57-101832, 58-040543, 58-040544, 61-107243, 62-187837, 62-187842, 63-034536 and 63-330064.

European Patent Publication No. 362827 discloses a positive-acting photothermographic element having a photosensitive medium comprising a heat-transferable colourant, a polymerisable monomer and a photoinitiator therefore. Upon exposure of the element to actinic radiation, polymerisation occurs in the light-struck regions of the element, thereby immobilising the colourant in those regions and generating a latent image. The exposed element is then contacted with an image receptor sheet and heated to transfer in an imagewise fashion colourant from the element to the receptor in the non-exposed regions of the element.

Japanese Patent No. 60-030931 discloses a positive-acting photothermographic element comprising as a photosensitive medium therefor, layers of heat sensitive colour forming reagents and a photopolymerisable monomer. Following exposure to light, photopolymerisation occurs in the light exposed regions, thereby immobilising one of the colour forming reagents and preventing it from mixing with the remaining components of the colour forming system during thermal processing. There is no discussion of the importance of choice of photoinitiator for generating positive, neutral images or of the preparation of compositions which do not absorb near UV light (340 to 400 nm) in the imaged areas of the element.

European Patent No. 223587 and U.S. Pat. Nos. 4,772,541, 4,800,149 and 4,865,942, disclose positive-acting photothermographic elements comprising microcapsules, each containing a monomer, a photoinitiator and a dye precursor or developer, dispersed in a binder layer. When the microcapsule containing layer is exposed to light of the appropriate wavelength, the monomer polymerises so as to immobilise the dye precursor or developer in the exposed regions. The exposed element is processed by contacting the element with an image receptor sheet under pressure and heating to develop the final image. The photoinitiator consists of an ionic dye-counter ion complex, such as a cationic dye-borate anion complex or an anionic dye-iodonium ion complex. There is no discussion of the necessity for producing images which are transparent to near UV light in the exposed regions. The only photobleachable sensitisers disclosed are 3-substituted coumarin derivatives which have a sensitivity within the range of 390 to 500 nm.

U.S. Pat. No. 4,761,360 discloses photothermographic elements having as a photosensitive medium therefor, a microencapsulated formulation comprising silver halide, a reducing agent, a free radical polymerisable compound, silver benzotriazole and a silver diazotate compound. The latent image centres produced in the exposed regions of the element act as a catalyst for the reduction of the diazotate compound to a diazohydroxide during development. The diazohydroxide decomposes on heating to produce free radicals which initiate polymerisation in the imaged areas. U.S. Pat. No. 4,753,862 discloses photothermographic elements of similar construction but which incorporate silver triazene compounds instead of silver diazotate.

Japanese Patent Nos. 61-183460, 61-188535 and 61-022841, European Patent Publication No. 301539, British Patent Publication No. 2195463 and U.S. Pat. No. 4,814,252 also disclosed positive-acting photothermographic elements which utilise polymerisation in light struck areas to generate an image. However, the preferred method of image formation is achieved by heating the photosensitive layer in contact with an image receiving layer. The photothermographic elements are usually colour-forming.

The present invention seeks to provide alternative positive-acting photothermographic materials which are suitable for use at contact speeds.

BRIEF SUMMARY OF THE INVENTION

According to the present invention there is provided a positive-acting photothermographic element comprising a base layer having at least two layers thereon, which layers define a photosensitive medium comprising a photocurable composition, a reducible silver source, and a reducing system for silver ion comprising one or more components including a compound capable of reducing silver ion to silver metal, such that the reducible silver source and at least one component of the reducing system for silver ion are present in separate layers wherein exposure of the element to actinic radiation causes curing of the photocurable composition in the exposed area(s), said curing preventing the reducing system from interacting with the reducible silver source during thermal processing and in which the photocurable composition comprises a free radical curable resin and a photoinitiator therefor having an absorbance to radiation in the wavelength range of 340 to 440 nm, which photoinitiator upon exposure to said actinic radiation or during subsequent thermal processing undergoes a loss of absorption in said wavelength range 340 to 440 nm.

Broadly, the photothermographic elements of the invention comprise a dispersing of a reducible silver source and a reducing system for silver ion in a photocurable resin system. In those areas of the element exposed to radiation, the photoinitiator promotes curing of the free radical curable resin thereby increasing the glass transition temperature (Tg) of the resin in those regions and effectively immobilising or otherwise preventing the reducing system from reacting with the reducible silver source during thermal processing. The reducing system comprises a reducing agent for silver ion (i.e., a developer) and toner. The toner enhances the effect of the reducing agent for silver ion. At least one component of the reducing system must be present in a layer separate from that containing the silver source. The photoinitiator is bleached or destroyed, either during imaging or subsequent thermal processing, to leave little or no residual staining (absorbance) in the imaged areas(s) of the element. The photothermographic elements of the invention produce well defined positive images and are suitable for applications in a wide range of imaging fields, including contact printing.

The invention also relates to a method of generating a positive image comprising (a) imagewise exposing a photothermographic element of the invention to actinic radiation to produce a latent image and (b) heating the exposed element to develop the latent image.

DESCRIPTION OF PREFERRED EMBODIMENTS

Figure 1:
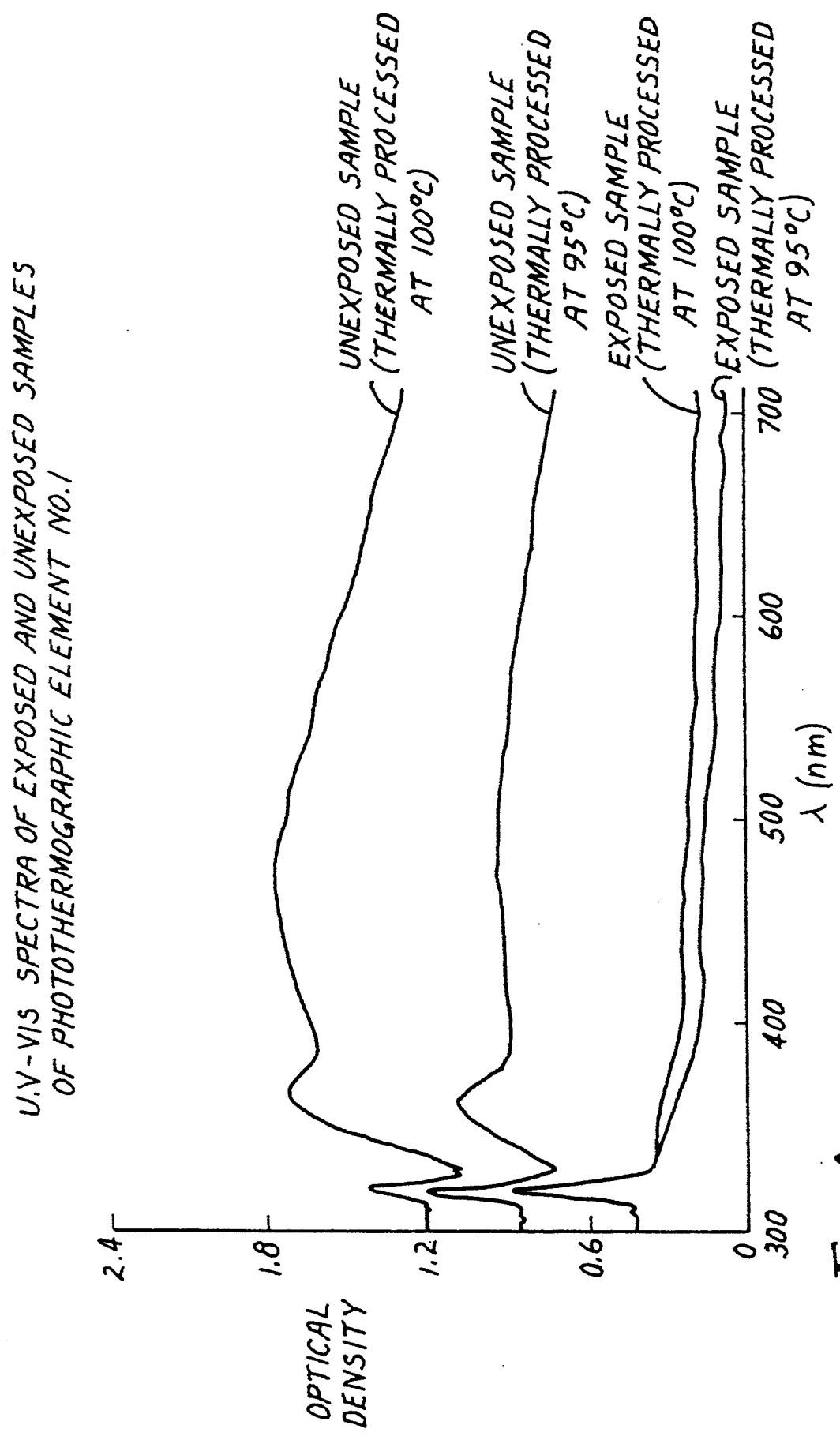
FIGS. 1–8 are plots of the ultraviolet to visible light absorption spectra of exposed and unexposed samples of certain photothermographic elements referred to in the examples of the specification.

The photothermographic elements of the invention generally comprise at least two binder layers within which are dispersed the reducible silver source, the reducing system and the photocurable composition, as well as optional additives such as coating aids and other adjuvants, e.g., anti-fading agents, surfactants etc. The reducible silver source is contained in one layer with at least one component of the reducing system contained in a separate layer. When a toner is present, at least one and more preferably both of the toner and reducing agent are contained in a layer separate from that containing the silver source.

In one embodiment, the photothermographic element comprises a support having on one surface thereof, a first binder layer comprising the reducible silver source and the photocurable composition and a second binder layer comprising the reducing system, e.g., reducing agent. The order of coating the first and second binder layers is not critical and may be reversed.

In an alternative embodiment, the photothermographic element has a three layer construction and comprises a support having on one surface thereof a first binder layer comprising the reducible silver source, a second binder layer comprising the photocurable composition and a third binder layer comprising at least one component of the reducing system. The order for coating the first and third layers may be reversed. In this embodiment, the second layer preferably comprises a microdispersion of the photocurable composition in a binder, such as gelatin, and acts as a photocurable barrier or interlayer to prevent the mixing of the reducing system with the reducible silver source. The interlayer may advantageously include one or more stabilising reagents, such as SPAN 20, as described in European Patent Application No. 345444.

The photothermographic elements may optionally be provided with an inert barrier layer coated on top of the other layers. Alternatively, a transparent film may be laminated on top of the element. Such barrier materials have the beneficial effect of preventing access of atmospheric oxygen to the layer containing the photocurable composition, thereby minimising oxygen-inhibition of the photocuring process. Suitable barrier materials include coatings of water-soluble polymers, such as gelatin, poly(vinyl alcohol), poly(vinyl pyrollidone) etc., optionally containing one or more surfactants, and laminated sheets of a transparent material, e.g., polyester, optionally treated with a surfactant or other release coating.

Generally, each layer of the photothermographic element (apart from the barrier layer) is coated at a wet thickness of from 25 to 250 $\mu$m and comprises from 1 to 90%, preferably 5 to 50% by weight of solids. The weight ratio of binder to photocurable composition is preferably from 3:1 to 1:3. The selection of values within the above ranges is found to enable the preparation of photothermographic elements having good stability, long shelf-life and high optical density contrast.

The photoinitiator may comprise any of the known photoinitiator systems able to promote polymerisation of the free radical curable resin with the proviso that the photoinitiator must undergo a loss of absorption in the wavelength range 340 to 440 nm either during imaging or during subsequent thermal processing. Generally, there should be a loss of at least 0.1, preferably at least 0.2 absorbance units at the $\lambda$ max of the photoinitiator. Preferably, the photoinitiator is bleached or otherwise destroyed to leave little, if any, residual staining in the imaged areas of the element. Following exposure the imaged areas of the element desirably have an absorption of no more than 0.2 at the $\lambda$ max of the photoinitiator, and preferably less.

Photoinitiation of free radical polymerisation is normally effected by either direct photocleavage of an initiator such as an onium cation, e.g., a sulphonium or iodonium cation, to yield free radicals capable of interacting with a free radical addition polymerisable and/or crosslinkable monomer or by sensitisation of the photocleavage using a sensitiser, e.g., an oxonol dye, whose absorption is matched to a desired spectral region. The term "photoinitiator" therefore covers both single compounds with the requisite photochemical properties and combinations of cleavable compounds with a sensitising dye(s). In the process of sensitisation, a photoexcited sensitiser transfers energy, or an electron to the initiator which then decomposes to yield the free radical polymerisation initiating species.

Examples of suitable photoinitiators include: xanthene dye complexes, as disclosed, e.g., in U.S. Pat. No. 4,924,009, in which a xanthene dye such as rose bengal, eosin, erythrosin, a fluorescein dye or an ester thereof, is complexed with an onium ion, e.g., sulphonium, phosphonium and iodonium cations, or pyrilium, hydrazinium or hydrazide ions; bleachable 3-substituted coumarin compounds, e.g., as disclosed in U.S. Pat. No. 4,147,552, such as 7-diethylamino-5',7'-dimethoxy-3,3'-carbonylbiscoumarin, 3,3'-carbonylbis-5,7-dimethoxycoumarin, 7-diethylamino-3,3'-carbonylbiscoumarin and 7-diethylamino-7'methoxy-3,3'-carbonylbiscoumarin; dialkoxyanthracenes, e.g., 9,10-diethyoxyanthracene; together with an onium salt;

$$\text{[indanone with 4-(dimethylamino)benzylidene substituent]}$$

1,4-dihydropyridine sensitisers such as those disclosed at the XIII$^{th}$ Symposium on Photochemistry, e.g., 3,5-bis(methoxycarbonyl)-2,6-dimethyl-4-phenyl-1,4-dihydropyridine, together with an onium salt; sulphonium salts, e.g., $$(C_6H_5)_2S^{\oplus}\text{—}\langle\text{phenyl}\rangle\text{—}S(C_6H_5);$$

and 1,3,5-triarylpyrazolines of the formula:

$$\text{[1,3,5-triarylpyrazoline structure with Ar groups]}$$

in which;

Ar represents an aryl group, together with an onium salt.

Preferred photoinitiators comprise an onium salt, preferably an iodonium salt in combination with an oxonol sensitiser dye.

The use of the combination of an oxonol dye and iodonium salt as the photoinitiator enables photothermographic elements to be prepared which can meet the desired functional requirements. For example, as the oxonol dye sensitiser is destroyed during the photopolymerisation and thermal processing steps, the coating in the imaged area(s) does not absorb UV light in the critical range 340 to 440 nm.

Any oxonol dye able to promote, in combination with an iodonium salt or other onium salt initiator, curing of the resin upon exposure of the element may be used in the present invention. By selection of an appropriate oxonol dye, a photothermographic element may be prepared which is sensitive to radiation of a selected wavelength band, the particular wavelength and the width of the band depending upon the absorption characteristics of the dye.

A preferred class of oxonol sensitising dyes has a nucleus of general formula (III):

$$\text{(III)} \quad X\text{—}C(CN)\text{=}C(R^5)\text{—}C(CN)\text{=}Y$$

in which;

X represents:

$$R^6O\text{—}\overset{O}{\underset{\|}{C}}\text{—}$$

$$R^6R^7N\text{—}\overset{O}{\underset{\|}{C}}\text{—}$$

or $$R^6\text{—}\overset{O}{\underset{\underset{O}{\|}}{\overset{\|}{S}}}\text{—}$$

Y represents:

Y represents:

$$R^6O\text{—}\overset{O^{\ominus}M^{\oplus}}{\underset{|}{C}}\text{=}$$

$$R^6R^7N\text{—}\overset{O^{\ominus}M^{\oplus}}{\underset{|}{C}}\text{=}$$

or $$R^6\text{—}\overset{O^{\ominus}M^{\oplus}}{\underset{\underset{O}{\|}}{\overset{|}{S}}}\text{—}$$

R$^5$ represents hydrogen, a halogen atom, (e.g., Cl, Br etc.), —CN, or an alkyl group comprising up to 5 carbon atoms, (e.g., methyl, ethyl etc.). which may optionally possess one or more substituents selected from halogen, cyano, hydroxy and alkoxy groups comprising up to 5 carbon atoms, R$^6$ represents an alkyl group comprising up to 10 carbon atoms, preferably up to 5 carbon atoms (e.g., propyl, isopropyl, butyl etc.), or an aryl group comprising up to 14 carbon atoms, preferably up to 10 carbon atoms (e.g., phenyl), each of which groups may optionally possess one or more substituents commonly found in the art of oxonol dye synthesis, such as, alkyl groups comprising up to 5 carbon atoms, alkoxy groups comprising up to 5 carbon atoms, aryl groups comprising up to 10 carbon atoms, halogen atoms, nitro groups, cyano groups etc., R$^7$ represents hydrogen or R$^6$, and M+ is a cation.

Preferred dyes of formula (III) have a nucleus of general formula (IV):

$$\text{(IV)} \quad R^8O\text{—}\overset{O}{\underset{\|}{C}}\text{—}C(CN)\text{=}CH\text{—}CH\text{=}C(CN)\text{—}\overset{O^{\ominus}}{\underset{|}{C}}\text{—}OR^8$$

in which;

each R$^8$ independently represents propyl, isopropyl, butyl or isobutyl.

The iodonium salt may comprise any of the iodonium salts known to the art, for example, those iodonium salts disclosed in U.S. Pat. Nos. 3,729,313, 3,741,769, 3,808,006, 4,026,705, 4,228,232, 4,250,053, 4,701,402 and 4,769,459. Either a single iodonium salt or a combination of two or more iodonium salts may be used.

Iodonium salts are compounds having a positively charged iodine atom bearing two covalently bonded carbon atoms and any anion. Aliphatic iodonium salts are not normally thermally stable at temperatures above 0° C. However, stabilised alkyl phenyl iodonium salts such as those disclosed in *Chemical Letters* (1982) pp. 65–6 are stable at ambient temperatures and may be used in the invention. The preferred compounds are diaryl, arylheteroaryl and diheteroaryl iodonium salts in which the carbon-to-iodine bonds are from aryl or heteroaryl groups.

Suitable iodonium salts may be represented by the formula:

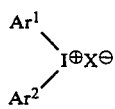

in which;

Ar$^1$ and Ar$^2$ independently represent aromatic groups optionally substituted and optionally linked together to include the iodine atom within a ring structure, and, X$^\ominus$ represents an anion.

The aromatic groups generally comprise from 4 to 20 carbon atoms, may be selected from aromatic carbocyclic rings, e.g., phenyl or naphthyl, and aromatic heterocyclic rings including thienyl, furanyl and pyrazolyl, and may be substituted with alkyl groups comprising up to 5 carbon atoms, e.g., methyl, alkoxy groups comprising up to 5 carbon atoms, e.g., methoxy, halogen atoms, such as chlorine, bromine, iodine and fluorine, carboxy groups comprising up to 5 carbon atoms, cyano or nitro groups, or any combination thereof. Condensed aromatic-heteroaromatic groups, e.g., 3-indolinyl, may also be present.

The ortho positions of the aryl groups may be linked together to include the iodine atom within a ring structure to give a formula such as:

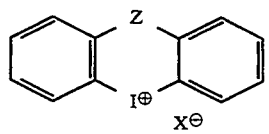

in which;

Z is an oxygen or sulphur atom.

Other suitable iodonium salts include polymers containing the monomeric unit:

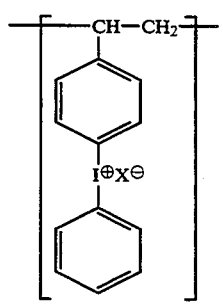

Many anions are known to be useful as the counterion in the iodonium salt. Preferably the acid from which the anion is derived has a pKa <5. Suitable inorganic anions include halide anions, HSO$_4^\ominus$, and halogen-containing complex anions, e.g., tetrafluoroborate, hexafluorophosphate, hexafluoroarsenate and hexafluoroantimonate. Suitable organic anions include those of the formulae:

R$^9$COO$^\ominus$ and R$^9$SO$_3^\ominus$ in which;

R$^9$ is an alkyl group or aryl group, e.g., a phenyl group, either of which may be substituted. Examples of such anions include CH$_3$COO$^\ominus$ and CF$_3$COO$^\ominus$.

X$^\ominus$ may also be present in Ar$^1$ or Ar$^2$, e.g.,

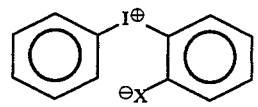

in which;

X$^\ominus$ is COO$^\ominus$ etc.

The most significant contribution of the anion is its effect upon the solubility of the iodonium salt in different solvents or binders.

Most of the iodonium salts are known, they may be readily prepared and some are commercially available. The synthesis of suitable iodonium salts is disclosed in F.M. Beringer et al., Journal of the American Chemical Society, 80, 4279 (1958).

Examples of iodonium salts useful in the present invention are:

| Example | Iodonium cation | Anion |
|---|---|---|
| A | ![diphenyliodonium] | CF$_3$CO$_2^\ominus$ |
| B | H$_3$C—⌬—I$^\oplus$—⌬—CH$_3$ | PF$_6^\ominus$ |
| C | Cl—⌬—I$^\oplus$—⌬—Cl | PF$_6^\ominus$ |
| D | bis(2,4,6-trimethylphenyl)iodonium | PF$_6^\ominus$ |
| E | H$_3$C—⌬—I$^\oplus$—⌬—CH$_3$ | Cl$^\ominus$ |
| F | diphenyliodonium | Br$^\ominus$ |

| Example | Iodonium cation | Anion |
|---|---|---|
| G | [diphenyliodonium] | SbF$_6^\ominus$ |
| H | [thienyl-phenyl iodonium] | CF$_3$CO$_2^\ominus$ |
| I | [bis(nitrophenyl) iodonium ether] | PF$_6^\ominus$ |
| J | [phenyl-(butoxyphenyl)iodonium] -O(CH$_2$)$_3$CH$_3$ | PF$_6^\ominus$ |

The oxonol dye and iodonium salt must be in reactive association on the support. Reactive association is defined as such physical proximity between the compounds as to enable a chemical reaction to take place between them upon exposure to light to promote curing. Normally, the dye and iodonium salt are in the same layer on the support. The weight ratio of oxonol dye-iodonium salt is generally from 20:1 to 1:50, preferably 2:1 to 1:10. The ratio of oxonol dye-iodonium salt is typically adjusted so that the UV absorption at the exposure wavelength is at least 0.3. The oxonol dye-iodonium salt photoinitiator is normally employed in an amount from 0.1 to 10% by weight of the free radical curable resin.

Although the free radical curable resin may comprise any suitable resin known in the art, free radical addition polymerisable or crosslinkable compounds, such as ethylenically or polyethylenically unsaturated compounds, are preferred. These compounds include monomers having one or more ethylenically unsaturated groups, such as vinyl or alkenyl groups, and polymers having terminal or pendant ethylenic groups. A wide variety of such compounds are known in the art and include acrylic and methacrylic esters of polyhydric alcohols, such as trimethylolpropane, pentaerythritol etc., and acrylate or methacrylate terminated epoxy, polyester or polyurethane resins. Preferred resins include tetraethylene glycol diacrylate, ethylene glycol dimethacrylate, diethylene glycol dimethacrylate, tetraethylene glycol diacrylate, tetraethylene glycol dimethacrylate, polyethylene glycol dimethacrylate, hexanediol diacrylate, trimethylolpropane triacrylate, trimethylolpropane trimethacrylate, hydantoin hexaacrylate, pentaerythritol tetraacrylate and pentaerythritol tetramethacrylate, either alone or in combination with polyethylene oxide-bisacrylate The photothermographic chemistry of the element is typically applied to the support in a binder. A wide range of binders may be employed in the various layers of the photothermographic element. Suitable binders are transparent or translucent, are generally colourless and include natural polymers, synthetic resins, polymers and copolymers and other film forming media such as: gelatin, gum arabic, poly(vinyl alcohol), hydroxyethyl cellulose, cellulose acetate, cellulose acetate butyrate, poly(vinyl pyrrolidone), casein, starch, poly(acrylic acid), poly(methylmethacrylic acid), poly(vinyl chloride) poly(methacrylic acid), copoly(styrene-maleic anhydride), copoly(styrene-acrylonitrile), copoly(styrene-butadiene), polyvinyl acetals e.g., poly(vinyl formal) and poly(vinyl butyral), polyesters, polyurethanes, phenoxy resins, poly(vinylidene chloride), polyepoxides, polycarbonates, poly(vinyl acetate), cellulose esters and polyamides. The binders may be coated from aqueous or organic solvents or an emulsion.

The reducible silver source may comprise any material which contains a reducible source of silver ions. Silver salts or organic and hetero-organic acids, particularly long chain fatty carboxylic acids (comprising from 10 to 30, preferably 15 to 25 carbon atoms) are preferred. Complexes of organic or inorganic silver salts in which the ligand has a gross stability constant for silver ion of between 4.0 and 10.0 are also useful. Examples of suitable silver salts are disclosed in Research Disclosure Nos. 17029 and 29963. The preferred silver source is silver behenate. The reducible silver source generally comprises from 5 to 70%, preferably from 7 to 45% by weight of the binder layer.

The reducing system for silver ion comprises at least a compound capable of reducing silver ion to silver metal. The reducing agent may be any of the conventional photographic developers known in the art, such as phenidone, hydroquinones and catechols, although hindered phenols are preferred. The reducing agent should be present in an amount of from 1 to 15% by weight of the binder layer.

Preferably the reducing system for silver ion also comprises one or more compounds, known in the photothermographic art as toners, which enhance the action of the developer. The precise mode of action of toners is not well understood, but it is believed that they catalyse the reaction between the developer and silver ions. They also influence the physical form of the silver metal produced in the reaction and hence the appearance ("tone") of the developed image. Because toners can exert a profound effect on the rate of the development reaction, it is found that modulating the supply of toner can be just as effective, in some circumstances, as modulating the supply of developer as the basis of image formation.

Toners are generally used in an amount corresponding to 0.2 to 12% by weight of the layer in which they are coated. The most commonly used toners include phthalazine, phthalazinone, phthalic acid (and its chloro derivatives) and phthalic anhydride (and its chloro derivatives), but the choice of toner will depend, amongst other things, on the choice of developer. Suitable combinations of developer and toner are disclosed, for example, in U.S. Pat. Nos. 3,770,448, 3,773,512 and 3,893,863, and Research Disclosure Nos. 17029 and 29963.

The preferred developer is:

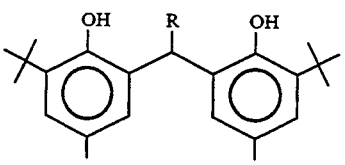

in which;

R represents hydrogen or an alkyl group generally comprising up to 5 carbon atoms, e.g., $C_4H_9$.

The preferred toner is:

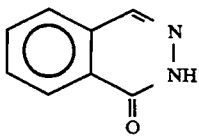

One, or both, of the developer and toner is employed in a layer separate from that containing the reducible silver source. In principle, the photocurable composition may be present in the same layer as the developer and/or toner, or in the same layer as the reducible silver source, or may be present in an intervening layer between the aforementioned layers. In any of these configurations, image-wise curing of the photocurable composition provides an image-wise barrier to the reaction of the reducible silver source with the ingredients necessary for the production of a visible image. However; it is found to be preferable in practice, especially when using the preferred developer (see above), to contain the developer and photocurable composition in separate layers as the developer is found to have an inhibitory effect on the polymerisation process by scavenging free radicals.

In one highly preferred embodiment, the photothermographic element comprises a support having on one surface thereof a first binder layer comprising the silver salt of an organic or hetero-organic acid, e.g., silver behenate, and the photocurable composition, preferably comprising an iodonium-oxonol photoinitiator, and a second binder layer comprising a developer. A toner is preferably present in at least the second binder layer.

In another highly preferred embodiment, the photothermographic element comprises a support having on one surface thereof a first binder layer comprising the silver salt of an organic or hetero-organic acid and a developer, a second binder layer comprising the photocurable composition, preferably in the form of a microdispersion of the photocurable composition in the binder, and a third binder layer comprising a toner.

Photothermographic elements in accordance with the invention are prepared by simply coating a suitable support or substrate with the two or more binder layers containing the photothermographic chemistry and, optionally, the barrier layer. Each layer is generally coated from a suitable solvent using techniques known in the art. Exemplary supports include materials such as paper, polyethylene-coated paper, polypropylene-coated paper, parchment, cloth and the like; sheets and foils of metals, such as aluminium copper, magnesium and zinc: glass and glass coated with metals, such as chromium, chromium alloys, steel, silver, gold and platinum; synthetic polymeric materials, such as poly(alkyl methacrylates), e.g., poly(methyl methacrylate), polyesters, e.g., poly(ethylene terephthalate), poly(vinylacetals), polyamides, e.g., nylon, cellulose esters, e.g., cellulose nitrate, cellulose acetate, cellulose acetate propionate, cellulose acetate buyrate, and the like. Transparent materials, especially poly(ethylene terephthalate) are preferred.

A variety of conventional additives, such as surfactants, anti-oxidants, stabilisers, plasticisers, ultraviolet absorbers, coating aids etc., may be used in the preparation of the photographic elements of the invention.

The supports can be sub-coated with known subbing materials, such as copolymers and terpolymers of vinylidene chloride with acrylic monomers (such as acrylonitrile and methyl acrylate) and unsaturated dicarboxylic acids (such as itaconic acid or acrylic acid), carboxymethyl cellulose, polyacrylamide, and similar polymeric materials.

The support can also carry a filter or antihalation layer, such as one comprising a dyed polymer layer which absorbs the exposing radiation after it passes through the radiation-sensitive layer and eliminates unwanted reflection from the support.

By suitable selection of the photoinitiator, an element of the invention may be prepared which is sensitive to radiation of a selected wavelength band within the general range 300 to 1000 nm, the particular wavelength and the width of the band depending upon the absorption characteristics of the sensitiser.

In use, the photothermographic elements of the invention are imagewise exposed to radiation of an appropriate wavelength to photolyse the photoinitiator, thereby curing the resin and creating a latent image. Following exposure, the element is dry processed by heating at temperatures of from 90° to 150° for 5 to 60 seconds, preferably 125° to 130° for 5 to 15 seconds, using techniques known in the art for the processing of negative-acting dry silver materials, to develop a positive image.

The invention will now be described with reference to the following Examples. A glossary of common abbreviations etc., is presented below for ease of comprehension.

| Resins | | Glossary |
|---|---|---|
| ATM4 | = | tetraethylene glycol dimethacrylate, commercially available from Ancomer Chemicals under the trade designation ATM4. |
| ATM5 | = | polyethylene glycol dimethacrylate, commercially available from Ancomer Chemicals under the trade designation ATM5. |
| ATM11 | = | trimethylolpropane trimethacrylate, commercially available from Ancomer Chemicals under the trade designation ATM11. |
| ATM12 | = | trimethylolpropane triacrylate, commercially available from Ancomer Chemicals under the trade designation ATM12. |
| CAB 381-20 | = | cellulose acetate butyrate commercially available from Kodak Ltd. |
| HHA | = | hydantoin hexaacrylate, as disclosed in U.S. Pat. No. 4,249,011. |

-continued
| Resins | Glossary |
|---|---|
| | 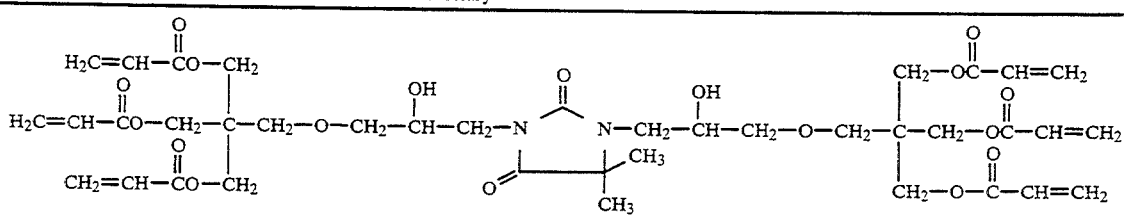 |
SENSITISER
Oxonol Dye A = 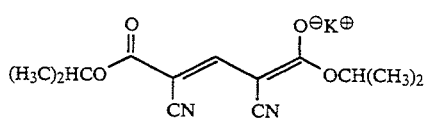
Oxonol Dye B = 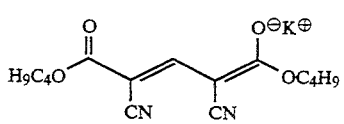
ITX = isopropylthioxanthone (a mixture of 2 and 4 isomers).
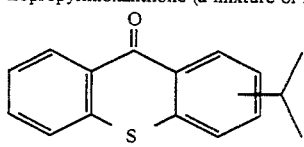
2-EA = 2-ethyl anthracene.
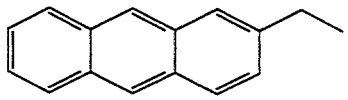
DPBO = diphenoxybenzophenone (prepared according to the synthesis protocol detailed below).
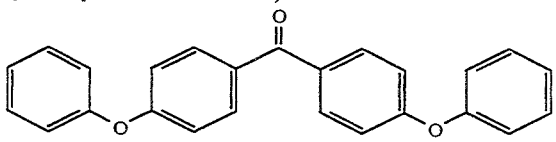
TPP = 1,3,5-triphenylpyrazoline
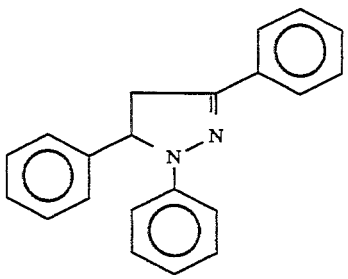
DH = 3,5-bis(methoxycarbonyl)-2,6-dimethyl-4-phenyl-1,4-dihydropyridine
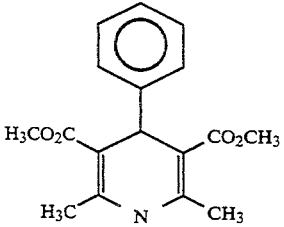
INITIATORS

| Resins | Glossary |
|---|---|
| Iodonium Salt A | = 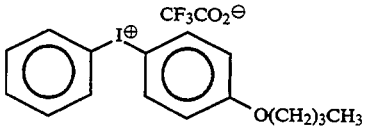 |
| Sulphonium Salt A | = 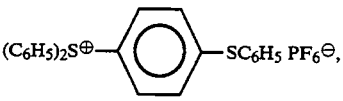
commercially available from Minnesota Mining and Manufacturing Company under the trade designation FX512. |
| Poly(vinyl cinnamate) | = copolymer of vinyl alcohol and vinyl cinnamate, commercially available from Polyscience Ltd. |
| MISCELLANEOUS | |
| Silver Behenate .(Full soap) | = 12.3% by weight silver behenate, 65.3% by weight methyl ethyl ketone 21.8% by weight toluene, and 0.5% by weight Butvar B-76. |
| K-bar | = wire wound coating rods manufactured by R.K. Print-Coat Instruments Ltd. |
| TONERS | |
| Toner A | = 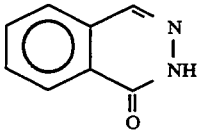 |
| DEVELOPERS | |
| Developer A R = H Developer B R = n-C$_4$H$_9$ | 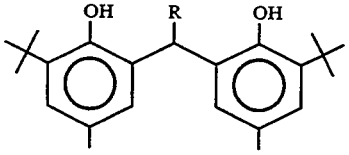 |

Synthesis of 4,4'-bis(phenoxy)benzophenone (DPBO)

DPBO was prepared according to the following protocol: 4-phenoxybenzoic acid (2.5 g, 11.7 mmol) was refluxed in thionyl chloride (50 ml) for 3 hours. The resulting mixture was allowed to cool and the solvent removed in vacuo to recover 4-phenoxybenzoyl chloride as a pale yellow oil (2.72 g, Yield=100%, λ max=1760 cm$^{-1}$). The 4-phenoxybenzoyl chloride (2.72 g, 11.7 mmol) in dichloromethane (20 ml) was added to diphenylether (1.99 g, 11.7 mmol) in dichloromethane (30 ml) followed by aluminium trichloride (1.56 g, 11.7 mmol) and the resulting mixture refluxed for 3 hours. The refluxed mixture was poured onto ice-water (approximately 100 ml) and the resulting layers separated. The aqueous layer was extracted with ether (2×100 ml extractions) and the combined organics dried, filtered and evaporated to recover the 4,4'-bis(phenoxy)benzophenone (2.76 g, yield=64%) as a colourless solid [melting point=130 to 132° C., λ max (EtOH)=291 nm (ε=2.3×10$^4$) and δH 6.9 to 7.9 (18H, M, Ar H)].

Synthesis of 3,5-bis(methoxycarbonyl)-2,6-dimethyl-4-phenyl-1,4-dihydropyridine (DH)

DH was prepared according to the following protocol: ammonium hydroxide (3.55 ml of a 0.88M solution) was added to an ice-cooled solution of benzaldehyde (6.4 g, 60 mmol) and methyl acetoacetate (14.0 g, 120 mmol) in ethanol (60 ml) and after the addition was complete, the mixture was heated at reflux for 3 hours before being allowed to cool. The mixture was 'scratched' to induce crystallisation and the resulting solid collected by suction filtration and dried in vacuo to give the dihydropyridine (5.6 g, Yield=33%) as colourless needles [m.p. 196 to 197° C. λ max.=3340, 1690 and 1640 cm$^{-1}$; λ max (EtOH)=353 nm (ε=6.45×10$^3$) and δH 2.20 (6H, S, 2×CH$_3$), 3.63 (6H, s, 2z CO$_2$CH$_3$), 5.00 (1H, S, PhC/H), 5.95 (1H, br.s, nH), and 7.10 to 7.35 (5H, M, 5×PhH)].

EXAMPLE 1

A range of photothermographic elements were prepared by coating an unsubbed 4 mil (100 μm) polyester support with the following coating formulations.

Photothermographic Elements Nos. 1 & 2: prepared in accordance with the invention and comprising in order of coating, a bottomcoat, a topcoat and a barrier layer as defined below. The barrier overlayer and topcoat are the same for both elements with the bottomcoat containing either HHA or the combination of ATM5 and ATM11 as the photocurable resin.

Barrier Overlayer: knife edge coating at 2 mil (50 μm) wet thickness.

| | |
|---|---|
| Poly(vinyl alcohol) 124K (8% solution) | 10 g |
| TERGITOL TMN-10 (10% solution) | 1 g |

Topcoat: knife edge coating at 2 mil (50 μm) wet thickness.

-continued

| Cellulose Acetate Butyrate 500-5 (10% solution in methyl ethyl ketone) (MEK)) | 10 g |
|---|---|
| Developer A | 0.2 g |
| Toner A | 0.1 g |
| Bottomcoat (Element No. 1): knife edge coating at 4 mil (100 μm) wet thickness. | |
| Silver Behenate (Full soap) | 10.0 g |
| Butvar B-76 (poly(vinyl butyral)) | 0.5 g |
| ATM11 | 1.0 g |
| ATM5 | 0.5 g |
| Iodonium Salt A | 0.1 g |
| Oxonol Dye A | 0.02 g |
| Bottomcoat (Element No. 2): knife edge coating at 4 mil (100 μm) thickness. | |
| Silver Behenate (Full soap) | 10.0 g |
| Butvar B-76 | 0.5 g |
| HHA | 1.5 g |
| Iodonium Salt A | 0.1 g |
| Oxonol Dye A | 0.02 g |

Photothermographic Element No. 3: prepared in accordance with the invention comprises in order of coating a bottomcoat, a photoimageable barrier (or interlayer) and a topcoat as defined below. The photoimageable barrier comprises a microdispersion of the photocurable composition in a gelatin binder.

| Bottomcoat | |
|---|---|
| Silver Behenate (Full soap) | 10 g |
| Developer A | 0.2 g |
| Cellulose Acetate Butyrate 500-5 | 0.5 g |
| Photoimageable barrier | |
| Oxonol Dye B | 0.1 g |
| Iodonium Salt A | 0.2 g |
| HHA | 2 g |
| ATM-4 | 2 g |
| Span 20 | 0.4 g |
| Ethanol solution | 5 g |
| TERGITOL TMN-10 (10% solution) | 1 g |

The above mixture was microdispersed into an aqueous gelatin dispersion (10g/100ml) over a period of 5 minutes. The dispersion was coated using the knife edge coater at 3 mil 75μm) wet thickness.

| Topcoat | |
|---|---|
| Toner A | 0.3 g |
| Cellulose Acetate Butyrate 500-5 | 1 g |
| Ethyl Urea | 0.1 g (added to facilitate migration of phthalazinone) |
| Methyl ethyl ketone | 10 g |

Photothermographic Element No. 4: as a comparative example the following construction was prepared comprising, in order of coating, a bottomcoat and a topcoat as defined below, and having as a photoinitiator the combination of isopropylthioxanthone and Iodonium Salt A.

| Topcoat: knife edge coating at 2 mil (50 μm) wet thickness. | |
|---|---|
| Cellulose Acetate (10% solution in MEK) | 10.0 g |
| Developer A | 0.2 g |
| Toner A | 0.1 g |
| Bottomcoat: knife edge coating at 2 mil (50 μm) wet thickness. | |
| Silver Behenate (Full soap) | 10.0 g |
| Butvar B-76 | 0.5 g |
| HHA | 1.0 g |
| ITX | 0.1 g |
| Iodonium Salt A | 0.2 g |

Photothermographic Element No. 5: again a comparative example comprising in order of coating, a bottomcoat, topcoat and barrier overlayer as defined below and having as a photoinitiator the combination of 2-ethylanthracene and Iodonium Salt A.

| Barrier overlayer: as per Elements Nos. 1 and 2 | |
|---|---|
| Topcoat: as per Elements Nos. 1 and 2 | |
| Bottomcoat: handspread coatings at K-bar 5. | |
| Silver Behenate (Full soap) | 10.0 g |
| Butvar B-76 | 0.5 g |
| ATM11 | 1.0 g |
| ATM5 | 0.5 g |
| 2-EA | 0.05 g |
| Iodonium Salt A | 0.1 g |

Photothermographic Element No. 6: a further comparative example comprising in order of coating, a bottomcoat, topcoat and barrier overlayer as defined below with the photoinitiator comprising the combination of diphenoxybenzophenone and Iodonium Salt A.

| Bottomcoat: knife edge coating at 4 mil (100 μm) wet thickness. | |
|---|---|
| Silver Behenate (Full soap) | 10 g |
| HHA | 0.5 g |
| ATM11 | 0.5 g |
| Butvar B-76 | 0.5 g |
| DPBO | 0.1 g |
| Iodonium Salt A | 0.2 g |
| Topcoat: knife edge coating at 2 mil (50 μm) wet thickness. | |
| Cellulose Acetate Butyrate 500-5 (10% solution in MEK) | 10 g |
| Developer A | 0.2 g |
| Toner A | 0.1 g |
| Barrier Overlayer: knife edge coating at 2 mil (50 μm) wet thickness. | |
| Poly(vinyl alcohol) 124K (8% solution | 10 g |
| TMN-10 (10% solution) | 1 g |

Photothermographic Element No. 7: another comparative example comprising in order of coating, a bottomcoat and a topcoat as defined below and having as a photoinitiator the combination of isopropylthioxanthone and poly(vinyl cinnamate).

| Bottomcoat: knife edge coating at 4 mil (100 μm) wet thickness. | |
|---|---|
| Silver Behenate (Full soap) | 11.2 g |
| Poly(vinyl cinnamate) | 1.0 g |
| Butvar B-76 | 0.6 g |
| ITX | 0.08 g |
| Topcoat: knife edge coating at 2 mil (50 μm) wet thickness. | |
| MEK | 7.0 g |
| Acetone | 3.0 g |

-continued

| | |
|---|---|
| Cellulose Acetate | 0.6 g |
| Developer A | 0.2 g |
| Toner A | 0.1 g |

Photothermographic Element No. 8: another comparative example comprising in order of coating, a bottom coat and a top coat as defined below and having as a photoinitiator the combination of diphenoxybenzophenone and methyldiethanolamine.

Topcoat: knife edge coating at 3 mil (75 μm) wet thickness.

| | |
|---|---|
| Cellulose Acetate (10% solution) | 10.0 g |
| Developer A | 0.3 g |
| Toner A | 0.15 g |
| Bottomcoat | |
| Silver Behenate (Full soap) | 10.0 g |
| Cellulose Acetate Butyrate 500-5 | 0.5 g |
| HHA | 1.5 g |
| DPBO | 0.05 g |
| Methyldiethanolamine | 0.15 g |

Control Element: the following construction was prepared having no photoinitiator and comprising in order of deposition, a bottomcoat and topcoat of defined composition.

Bottomcoat: knife edge coating at 4 mil (100 μm) wet thickness.

| | |
|---|---|
| Silver Behenate (Full soap) | 20.0 g |
| Methyl ethyl ketone | 3.0 g |
| Cellulose Acetate Butyrate 500-5 | 1.25 g |

Topcoat: knife edge coating at 2 mil (50 μm) wet thickness.

| | |
|---|---|
| Acetone | 3.0 g |
| Cellulose Acetate | 0.6 g |
| Developer A | 0.2 g |
| Toner A | 0.1 g |
| Methyl ethyl ketone | 7.0 g |

Samples of each construction were imagewise exposed to UV radiation (50 units) using a 6 kW Nu-arc UV lamp and thermally processed to develop the image. The type (positive/negative) and colour of the resulting images were recorded and the optical density at wavelengths greater than 400 nm of the exposed (Dmin) and unexposed (Dmax) regions measured using a DT1405 transmission densitometer.

Figure 2:
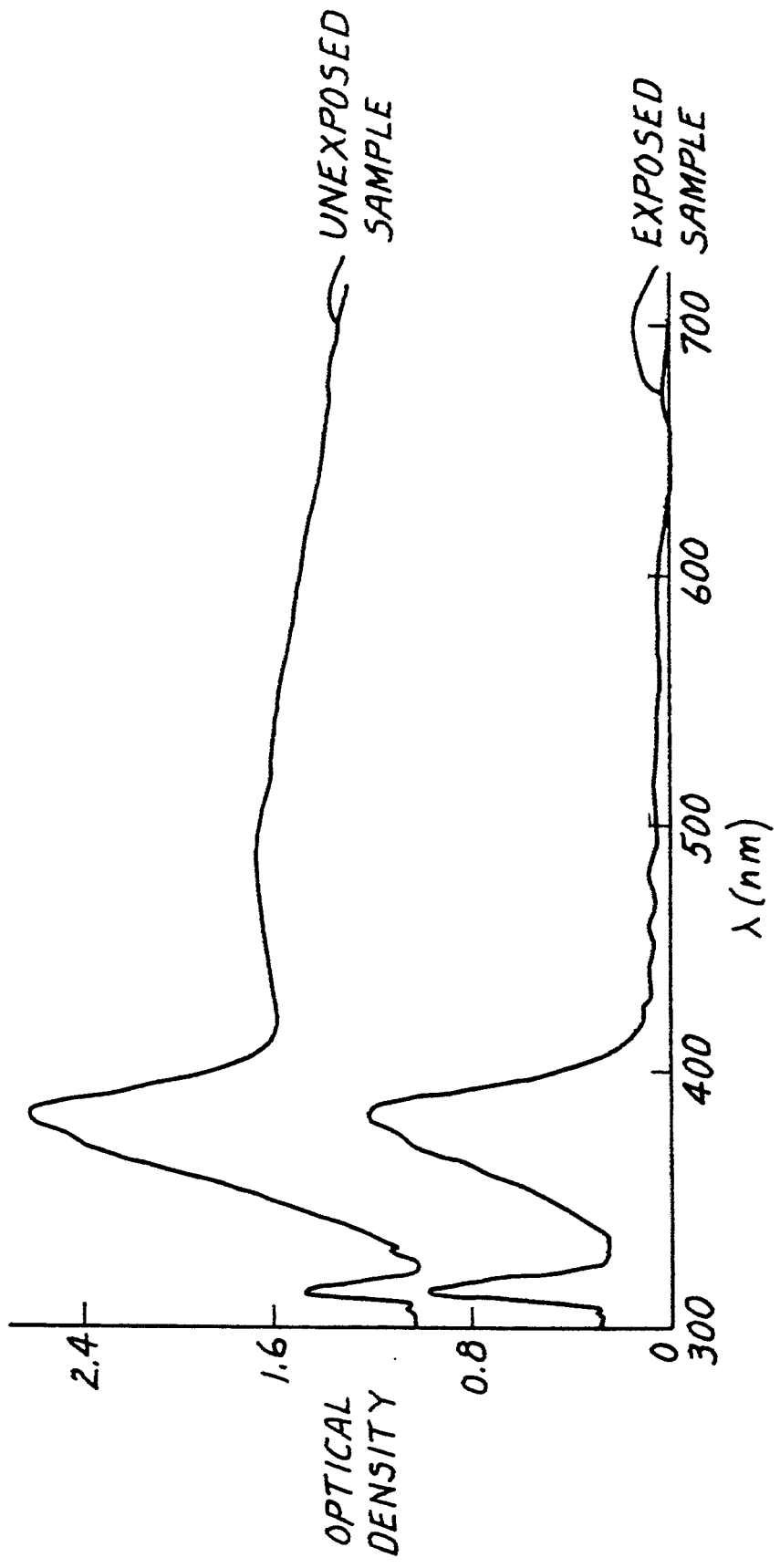
Figure 3:
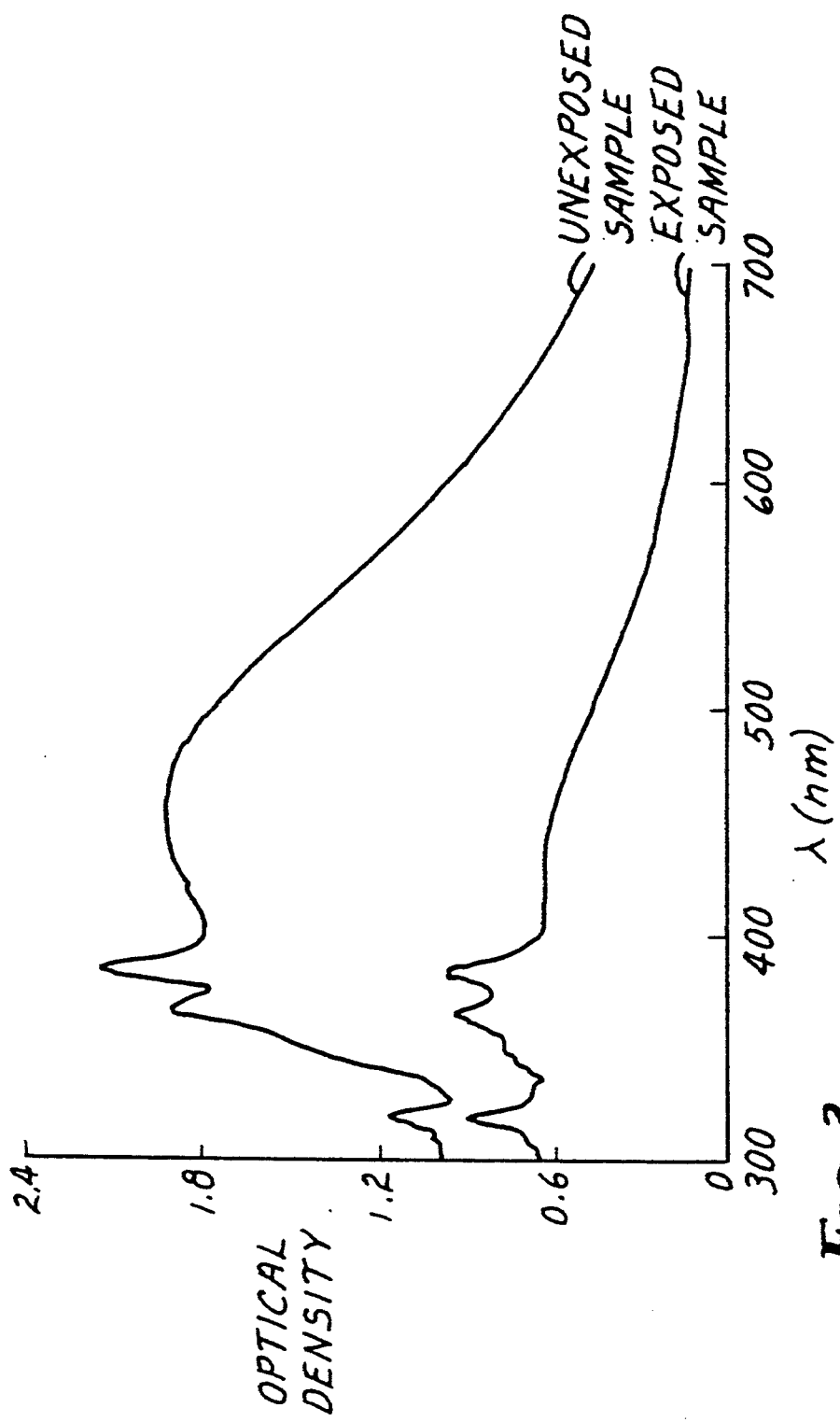

The UV absorption spectrum of the imaged samples was also measured following imaging and thermal processing to investigate the extent of absorption over the critical region of 340 to 440 nm. To illustrate this point, the UV-VIS absorption spectra of samples of Elements Nos. 1, 4 and 5 were measured after imagewise UV irradiation and thermal processing. For Element No. 1 there is very little residual absorption (see FIG. 1) of UV light across the critical region of 340 to 440 nm, whereas the UV spectra of comparative Elements Nos. 4 (see FIG. 2) and 5 (see FIG. 3) indicate that the sensitiser, namely isopropylthioxanthone and 2-ethylanthracene is still present after irradiation and thermal processing.

The results obtained are conveniently summarised in Tables 1 and 2 below.

The photothermographic elements of the invention (Nos. 1 to 3) produce a pleasing, well-defined, black and white positive image, with imaged regions absorbing very little U.V. light in the wavelength range 340 to 440 nm. This would indicate that the photoinitiator is destroyed during imaging and/or subsequent thermal processing. In contrast, the comparative photothermographic elements (Nos. 4 to 8) produced, in the majority of cases, a poorly toned image with the U.V. spectra indicating that the sensitiser is not being destroyed during processing.

TABLE 1

| Element No. [(c) = comparative example] | Photoinitiator System | Image | Colour | Imaged regions transparent to UV light (340 to 440 nm) |
|---|---|---|---|---|
| 1 to 2 | Oxonol Dye A/ Iodonium Salt A | Positive | Neutral (B & W) | Yes |
| 3 | Oxonol Dye B/ Iodonium Salt A | Positive | Neutral | Yes |
| 4 (c) | ITX/Iodonium Salt A | Positive | Neutral | No |
| 5 (c) | 2-EA/Iodonium Salt A | Positive | Red/Brown | No |
| 6 (c) | DBPO/Iodonium Salt A | Positive | Red/Brown | No |
| 7 (c) | ITX/Polyvinylcinnamate | Negative (Faint) | Yellow/Grey | No |
| 8 (c) | DBPO/Amine | No image | — | — |
| Control | None | Negative (Faint) | Neutral | No |

TABLE 2

| Element No. [(c) = comparative example] | Photinitiator system | Monomer | Processing temp. (°C.)** | Dmax*** | Dmin*** |
|---|---|---|---|---|---|
| 1 | Oxonol Dye A/ Iodonium Salt A | ATM 5/ATM 11 | 100 | 1.62 | 0.14 |
| 2 | Oxonol Dye A/ Iodonium Salt A | HHA | 115 | 1.02 | 0.11 |
| 3 | Oxonol Dye B/ | HHA/ATM 4 Micro- | 125 | 0.46 | 0.08 |

TABLE 2-continued

| Element No. [(c) = comparative example] | Photoinitiator system | Monomer | Processing temp. (°C.)** | Dmax*** | Dmin*** |
|---|---|---|---|---|---|
| 3 | Iodonium Salt A | dispersion in gelatin) | 130 | 1.21 | 0.36 |
| 4 (c) | ITX/Iodonium Salt A | HHA | 115 | 1.74 | 0.08 |
| 5 (c)* | 2-EA/Iodonium Salt A | ATM 5/ATM 11 | 120 | 1.21 | 0.28 |
| 6 (c) | DBPO/Iodonium Salt A | HHA/ATM | 105 | 0.77 | 0.06 |

*Sample given 25 units of UV irradiation (all other units given 50 units) using a 6 kW Nuarc UV lamp.
**Samples were processed for 10 seconds.
***Dmin/Dmax of silver image (at wavelengths greater than 400 nm)

EXAMPLE 2

This Example demonstrates the use of sulphonium salts as photoinitiators for photothermographic elements of the invention.

Photographic Element No. 9: prepared in accordance with the invention and comprising in order of coating, a bottomcoat and a topcoat as defined below.

| Bottomcoat: knife edge coating at 6 mil (150 μm) wet thickness. | |
|---|---|
| Silver Behenate (Full soap) | 10.0 g |
| Cellulose Acetate Butyrate 381-20 | 0.5 g |
| ATM 12 | 0.5 g |
| HHA | 1.0 g |
| Sulphonium Salt A | 0.05 g |
| Methyl ethyl ketone | 5 g |
| Topcoat: knife edge coating at 6 mil (150 μm) wet thickness. | |
| Cellulose Acetate (10% solution) | 10 g |
| Developer A | 0.3 g |
| Toner A | 0.1 g |

Individual samples were imagewise exposed to 50 units of UV radiation and thermally processed at various temperatures. The optical densities of the exposed (Dmax) and unexposed (Dmin) regions are shown in Table 3 below.

TABLE 3

| Thermal Processing Temperature (°C.) | Optical Density | |
|---|---|---|
| | Dmin | Dmax |
| 105 | 0.03 | 0.04 |
| 110 | 0.03 | 0.08 |
| 112 | 0.07 | 0.77 |
| 115 | 0.18 | 1.55 |
| 117 | 1.12 | 3.98 |
| 120 | 2.38 | 4.38 |

Figure 4:
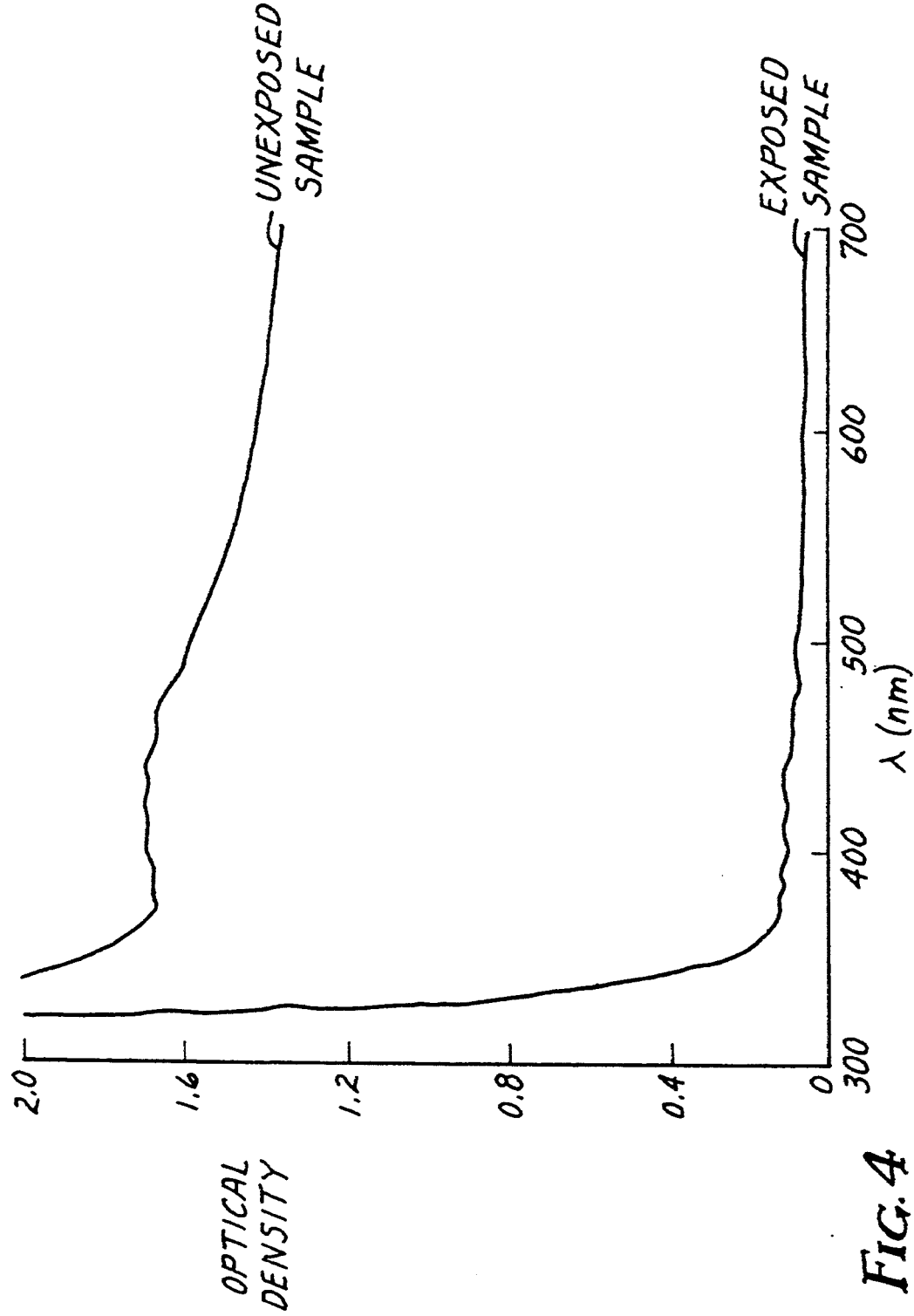

The images produced were positive and neutral in colour. The UV-VIS spectra was measured after both UV irradiation and thermal processing (see FIG. 4) and clearly shows a loss of absorption across the critical region of 340 to 440 nm.

EXAMPLE 3

This Example demonstrates the use of dialkoxyanthracenes as sensitisers for photothermographic elements of the invention.

Photothermographic Element No. 10: prepared in accordance with the invention and comprising in order of coating, a bottomcoat and a topcoat as defined below.

| Bottomcoat: knife edge coating at 6 mil (150 μm) wet thickness. | |
|---|---|
| Stock solution | 10 g |
| 9,10-diethoxyanthracene | 0.007 g |
| Iodonium Salt A | 0.065 g |
| Stock solution: | |
| Silver Behenate (Full soap) | 36.1 g |
| Cellulose Acetate Butyrate 381-20 | 1.8 g |
| ATM 12 | 6.3 g |
| Methyl ethyl ketone | 18 g |
| Topcoat: knife edge coating at 6 mil (150 μm) wet thickness. | |
| Cellulose Acetate (10% solution) | 10 g |
| Developer B | 0.4 g |
| Toner A | 0.15 g |

Individual samples were imagewise exposed to 25 and 50 units of UV radiation and thermally processed at various temperatures. The optical densities of the exposed (Dmin) and unexposed (Dmax) regions are shown in Table 4 below.

TABLE 4

| Thermal Processing Temperature (°C.) | UV Exposure | | | |
|---|---|---|---|---|
| | 25 Units | | 50 Units | |
| | Dmin | Dmax | Dmin | Dmax |
| 100 | — | — | 0.04 | 0.11 |
| 105 | 0.04 | 0.15 | 0.04 | 0.16 |
| 110 | 0.07 | 0.71 | 0.05 | 0.56 |
| 115 | 0.14 | 1.34 | 0.12 | 1.49 |
| 120 | — | — | 0.56 | 2.89 |

Figure 5:
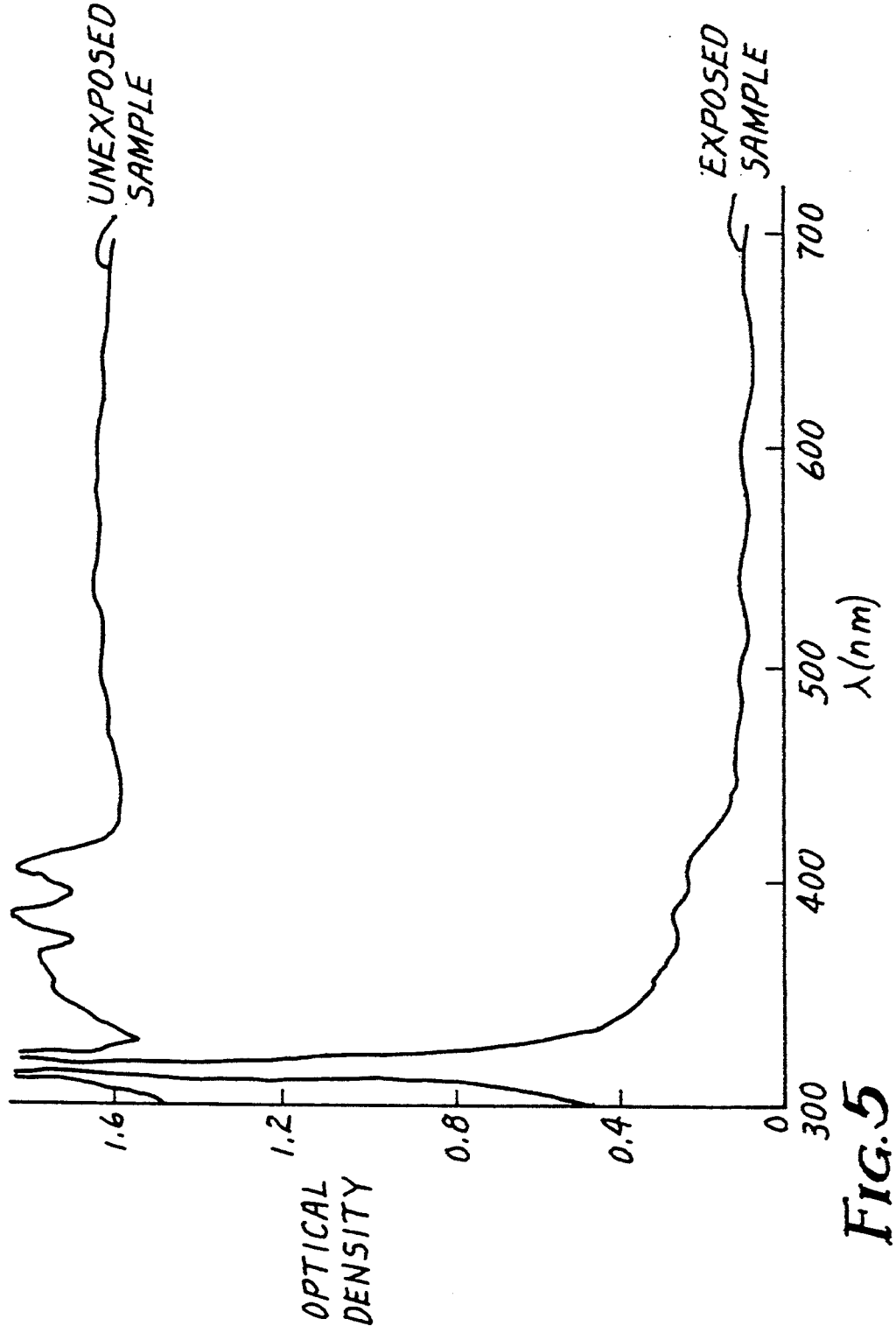

The images produced were positive and neutral in colour. The UV-VIS spectrum was measured after both UV irradiation and thermal processing (see FIG. 5) and clearly shows a loss of absorption across the critical region of 340 to 440 nm.

EXAMPLE 4

Photothermographic Elements Nos. 11 and 12: prepared in accordance with the invention and having as a photoinitiator the combination of 1,3,5-triphenyl-pyrazoline and an iodonium salt with and without an oxonol dye as an additional sensitiser. Each element comprises in order of coating, a bottomcoat and a topcoat as defined below. The topcoat is the same for both elements.

| Photothermographic Element No. 11 | |
|---|---|
| Bottomcoat: knife edge coating at 4 mil (100 μm) wet thickness. | |
| Stock solution prepared in Example 3 | 10 g |
| TPP | 0.01 g |
| Iodonium Salt A | 0.05 g |
| Topcoat: knife edge coating at 4 mil (100 μm) wet thickness. | |
| Cellulose Acetate (10% solution) | 10 g |
| Developer A | 0.25 g |
| Toner A | 0.1 g |

| Photothermographic Element No. 12 | |
|---|---|
| Bottomcoat: knife edge coating at 6 mil (150 μm) wet thickness. | |
| Silver Behenate (Full soap) | 10 g |
| Cellulose Acetate Butyrate 381-20 | 0.5 g |
| ATM12 | 1.5 g |
| Iodonium Salt A | 0.05 g |
| Oxonol Dye B | 0.0018 g |
| TPP | 0.0031 g |
| Methyl ethyl ketone | 5 g |
| Topcoat: as per Photographic Element No. 11. | |

Individual samples of each of Photothermographic Elements Nos. 11 and 12 were imagewise exposed to 50 units of UV radiation and thermally processed at various temperatures. The optical densities of the exposed (Dmin) and unexposed (Dmax) areas are shown in Table 5 below.

TABLE 5

| Thermal Processing Temperature (°C.) | Element No. | | | |
|---|---|---|---|---|
| | 11 | | 12 | |
| | Dmin | Dmax | Dmin | Dmax |
| 95 | 0.04 | 0.05 | 0.03 | 0.05 |
| 100 | 0.03 | 0.06 | 0.04 | 0.08 |
| 105 | 0.03 | 0.13 | 0.03 | 0.14 |
| 110 | 0.03 | 0.28 | 0.03 | 0.36 |
| 115 | 0.04 | 1.42 | 0.04 | 1.03 |
| 120 | 0.12 | 2.49 | 0.22 | 2.57 |

Figure 6:
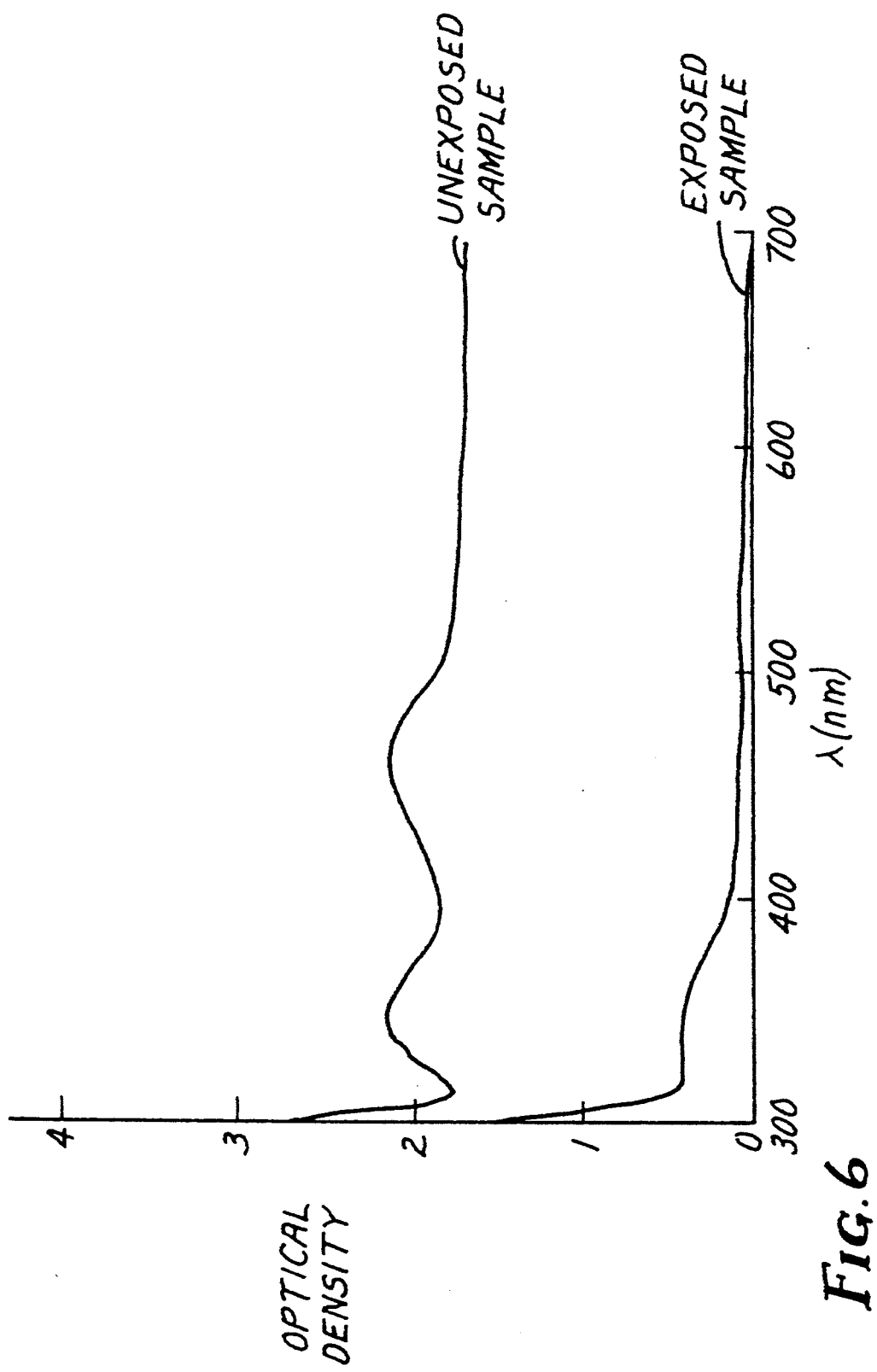
Figure 7:
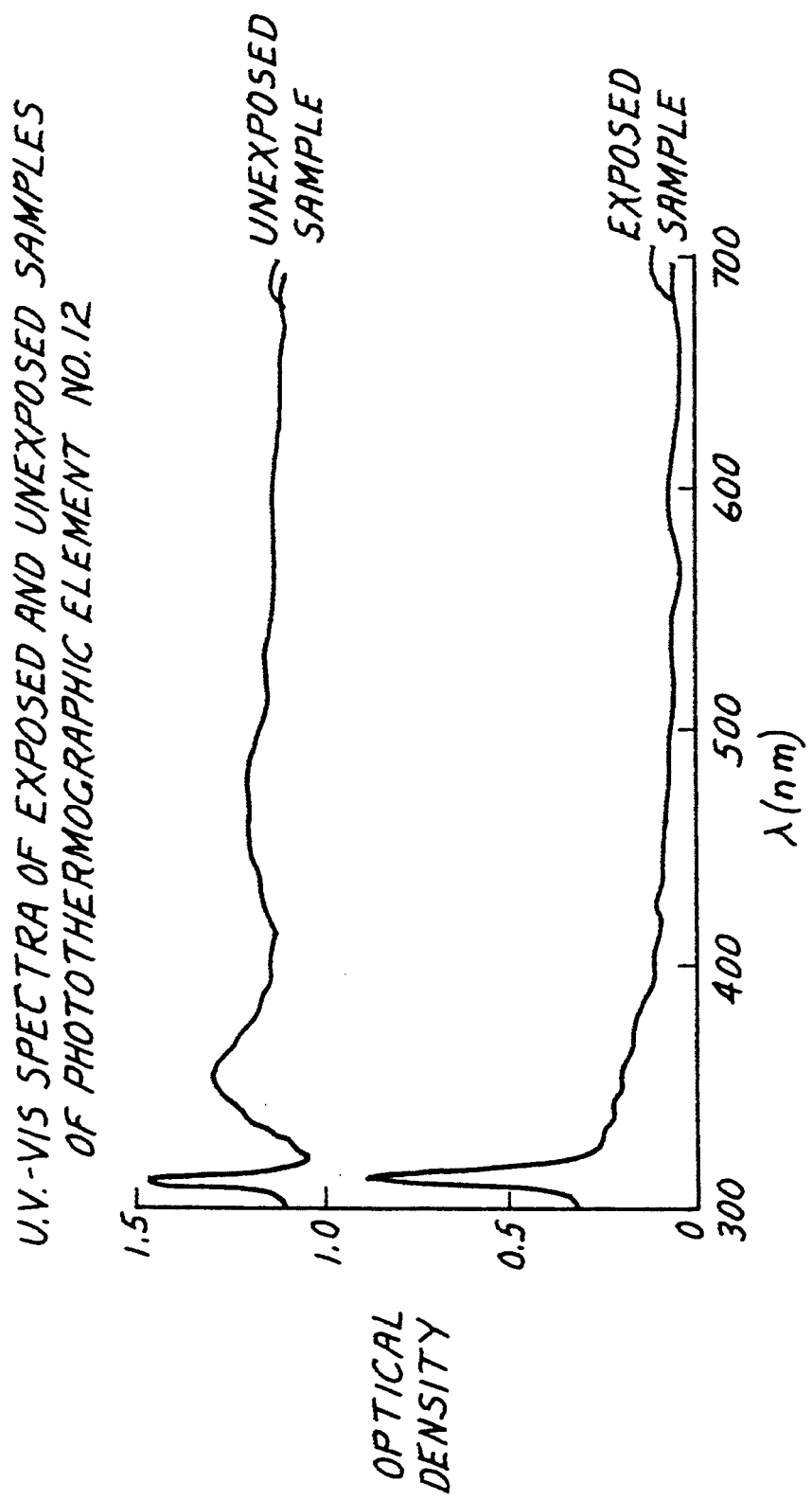

The images produced were positive and neutral in colour. The UV-VIS spectra of samples of each element were measured after both UV irradiation and thermal processing (see FIGS. 6 and 7 respectively) and clearly show a loss of absorption across the critical region of 340 to 440 nm.

Another unexpected benefit of using triarylpyrazoline compounds as the sensitiser in that the O.D. of exposed samples (Dmin) only increases slightly on storage. This is illustrated in Table 6 below which records the Dmin of exposed samples of Photothermographic Elements Nos. 11 and 12 both before and after storage for 5 to 6 weeks.

TABLE 6

| Thermal Processing Temperature (0° C.) | Element No. | | | |
|---|---|---|---|---|
| | 11 Dmin | | 12 Dmin | |
| | Before Storage | After* Storage | Before Storage | After** Storage |
| 95 | 0.04 | 0.04 | 0.03 | 0.05 |
| 100 | 0.03 | 0.06 | 0.04 | 0.04 |
| 105 | 0.03 | 0.06 | 0.03 | 0.04 |
| 110 | 0.03 | 0.06 | 0.03 | 0.04 |
| 115 | 0.04 | 0.07 | 0.04 | 0.05 |
| 120 | 0.12 | 0.18 | 0.22 | 0.25 |

*42 days
**38 days

EXAMPLE 5

This Example demonstrates the use of 1,4-dihydropyridines as photoinitiators for photothermographic elements of the invention.

Photothermographic Elements Nos. 13 and 14: prepared in accordance with the invention and having as a photoinitiator, the combination of 3,5-bis(methoxycarbonyl)-2,6-dimethyl-4-phenyl-1,4-dihydropyridine and an iodonium salt. Each element comprises in order of coating, a bottomcoat and a topcoat as defined below. The topcoat is the same for both elements with the bottomcoat comprising either ATM12 or HHA as the photocurable resin.

| Photothermographic Element No. 13 | |
|---|---|
| Bottomcoat: knife edge coating at 6 mil (150 μm) wet thickness. | |
| Silver Behenate (Full soap) | 10 g |
| Cellulose Acetate Butyrate 381-20 | 0.5 g |
| ATM12 | 1.5 g |
| Iodonium Salt A | 0.175 g |
| DH | 0.025 g |
| Methyl ethyl ketone | 5 g |
| Topcoat: knife edge coating at 6 mil (150 μm) wet thickness. | |
| Cellulose Acetate (10% solution) | 10 g |
| Developer A | 0.3 g |
| Toner A | 0.1 g |

| Photothermographic Element No. 14 | |
|---|---|
| Bottomcoat: knife edge coating at 6 mil (150 μm) wet thickness. | |
| Silver Behenate (Full soap) | 10 g |
| Cellulose Acetate Butyrate 381-20 | 0.5 g |
| HHA | 1.5 g |
| Iodonium Salt A | 0.12 g |
| DH | 0.02 g |
| Methyl ethyl ketone | 5 g |
| Topcoat: as per Photothermographic Element No. 13 | |

Individual samples of each of Photothermographic Elements No. 14 and 15 were imagewise exposed to 25 units of UV radiation and thermally processed at various temperatures. The optical densities of the exposed (Dmin) and unexposed (Dmax) areas of each element are shown in Table 7 below.

TABLE 7

| Thermal Processing Temperature (°C.) | Element No. 13 Dmin | Element No. 13 Dmax | Element No. 14 Dmin | Element No. 14 Dmax |
|---|---|---|---|---|
| 100 | 0.03 | 0.04 | — | — |
| 105 | 0.03 | 0.08 | 0.03 | 0.03 |
| 110 | 0.04 | 0.28 | 0.03 | 0.03 |
| 115 | 0.06 | 0.66 | 0.04 | 0.06 |
| 120 | 0.17 | 0.93 | 0.04 | 0.08 |
| 125 | 1.08 | 1.87 | 0.13 | 0.36 |
| 130 | — | — | 1.08 | 1.69 |

Figure 8:
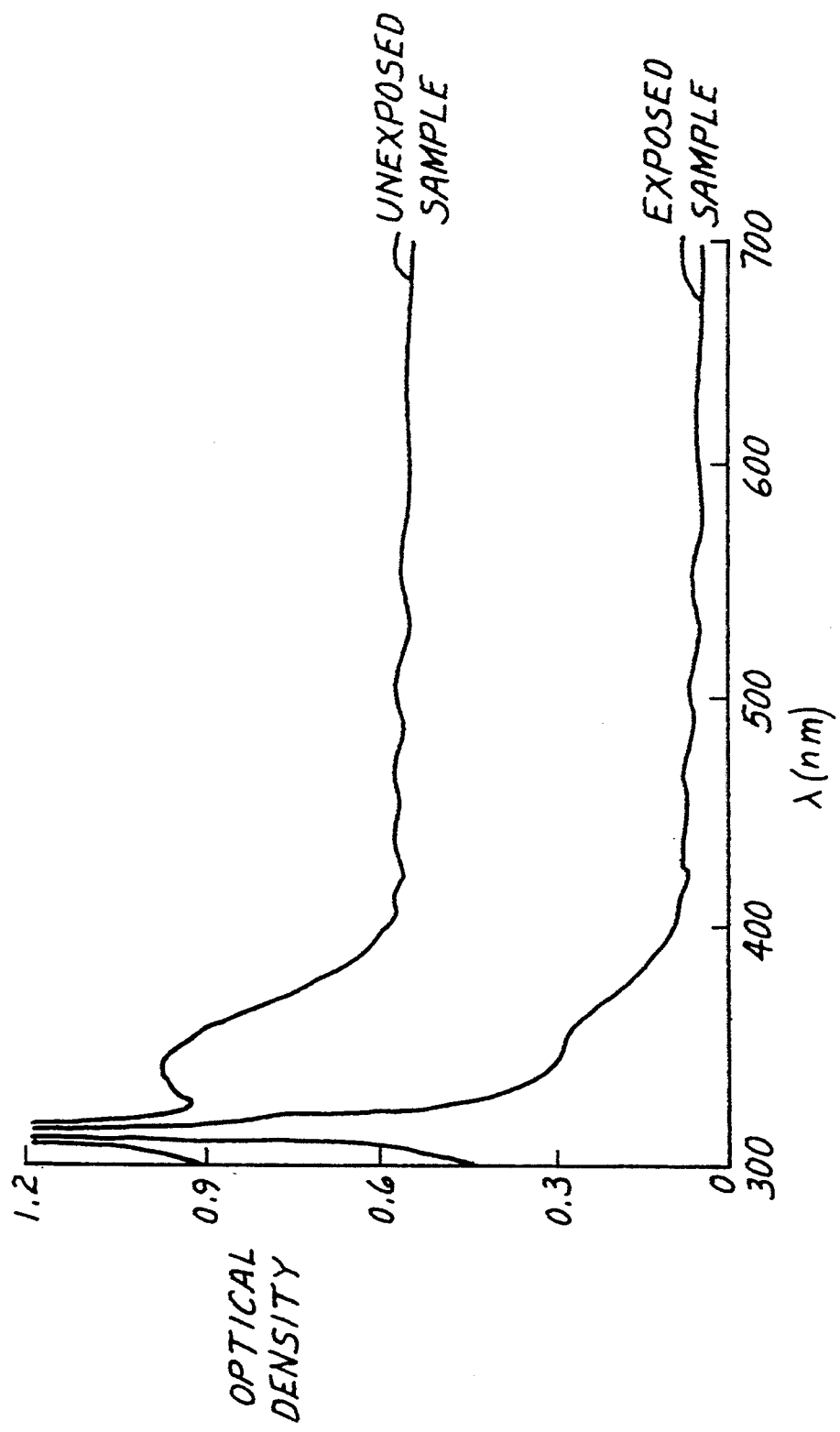

The images produced were positive and neutral (B & W) in colour. The UV-VIS spectra of Element No. 13 was measured after both UV irradiation and thermal processing (see FIG. 8) and clearly shows a loss of absorption across the critical region of 340 to 440 nm.

"ATM 4", "ATM 5", "ATM 11", "ATM 12" (Ancomer Chemicals), "SPAN 20", "DT 1405", "NU-ARC", "TERGITOL", "BUTVAR B-76" and "FX 512" (Minnesota Mining and Manufacturing Company) are all trade names.

We claim:

1. A positive-acting photosensitive element comprising a support having at least a first layer and a second layer on one surface thereof, which first and second layers define a non-photosensitive, heat-developable medium and a photosensitive photocurable medium; said non-photosensitive heat developable medium consisting essentially of a non-photosensitive reducible silver source, and a reducing system comprising a reducing agent for silver ion and toner, such that said first layer comprises said non-photosensitive reducible silver source and said photocurable medium and said second layer comprises said reducing system; wherein exposure of said positive-acting photosensitive element to actinic radiation causes curing of said photosensitive photocurable medium in the exposed areas, said curing preventing said reducing agent for silver ion and/or said toner of said reducing system from interacting with said non-photosensitive reducible silver source during thermal processing and in which said photosensitive photocurable medium consists essentially of a free radical curable resin and a photoinitiator therefor which is a combination of an oxonol dye and an onium salt having an absorbance to radiation in the wavelength range of 340 to 440 nm, which photoinitiator upon exposure to said actinic radiation or during subsequent thermal processing undergoes a loss of absorption in said wavelength range 340–440 nm.

2. The positive-acting photosensitive element according to claim 1 further comprising, as a topcoat, an oxygen-impermeable barrier layer.

3. The positive-acting photosensitive element according to claim 1 wherein said oxonol dye is selected from compounds having a nucleus of general formula:

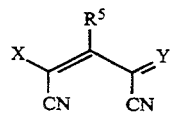

in which;

M+ is a cation,

X is a member selected from the group consisting of:

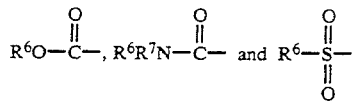

Y is a member selected from the group consisting of:

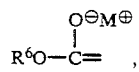

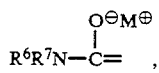

and

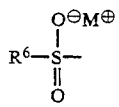

R$^5$ is a member selected from the group consisting of hydrogen, a halogen atom, CN, and an alkyl group comprising up to 5 carbon atoms which may optionally possess one or more substituents selected from halogen, cyano, hydroxy and alkoxy groups comprising up to 5 carbon atoms, R$^6$ is a member selected from the group consisting of an alkyl group comprising up to 10 carbon atoms, and an aryl group comprising up to 14 carbon atoms, each of which groups may optionally possess one or more substituents selected from alkyl groups comprising up to 5 carbon atoms, alkoxy groups comprising up to 5 carbon atoms, aryl groups comprising up to 10 carbon atoms, halogen atoms, nitro groups and cyano groups, and R$^7$ is a member selected from the group consisting of H and R$^6$ and said iodonium salt is selected from compounds having a nucleus of the following general formula:

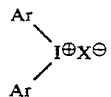

in which:

Ar$^1$ and Ar$^2$ are independently selected from the group consisting of aromatic carbocyclic, heterocyclic and diheterocyclic rings comprising from 4 to 20 carbon atoms, optionally linked together to include the iodine atom within a ring structure, each of which groups may possess one or more substituents selected from alkyl groups comprising up to 5 carbon atoms, alkoxy groups comprising up to 5 carbon atoms, halogen atoms, carboxy groups comprising up to 5 carbon atoms, cyano groups and nitro groups, the weight ratio of the oxonol dye:iodonium salt being in the range from 20:1 to 1:50.

4. The positive-acting photosensitive element according to claim 3 wherein said oxonol dye has a nucleus of general formula (IV):

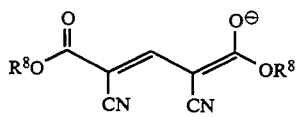

in which:

each $R^8$ is independently selected from the group consisting of propyl, isopropyl, butyl, and isobutyl and said iodonium salt comprises a cation which is a member selected from the group consisting of

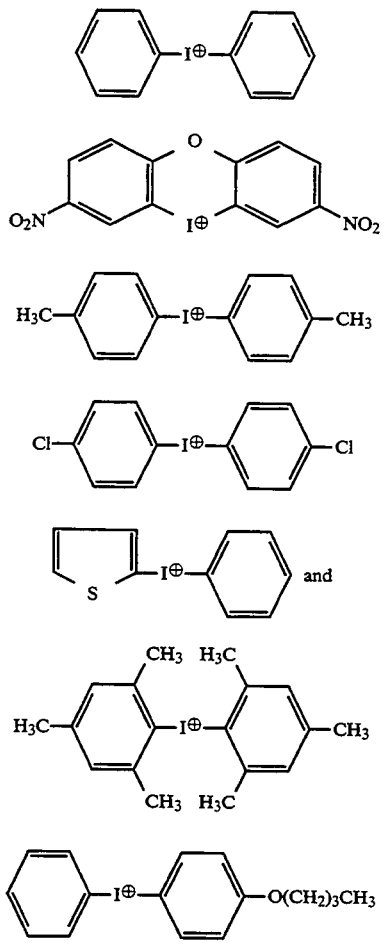

and an anion which is a member selected from the group consisting of $Cl^\ominus$, $Br^\ominus$, $SbF_6^\ominus$, $AsF_6^\ominus$, $HSO_4^\ominus$, $CF_3SO_3^\ominus$, $BF_4^\ominus$, and $C_7H_7SO_3^\ominus$.

5. The positive-acting photosensitive element according to claim 1 wherein said free radical curable resin is a member selected from the group consisting of an acrylic or a methacrylic ester of a polyhydric alcohol, an acrylate or methacrylate terminated epoxy, polyester or polyurethane resin, and combinations thereof.

6. The positive-acting photothermographic element according to claim 5 wherein said resin is a member selected from the group consisting of tetraethylene glycol diacrylate, ethylene glycol dimethacrylate, diethylene glycol dimethacrylate, tetraethylene glycol diacrylate, tetraethylene glycol dimethacrylate, polyethylene glycol dimethacrylate, hexanediol diacrylate, trimethylolpropane triacrylate, trimethylolpropane trimethacrylate, hydantoin hexaacrylate, pentaerythritol tetracrylate, pentaerythritol tetramethacrylate and combinations thereof.

7. The positive-acting photosensitive element according to claim 1 wherein said non-photosensitive reducible silver source is silver behenate.

8. The positive-acting photosensitive element according to claim 1 wherein said reducing agent for silver ion is a member selected from the group consisting of phenidone, hydroquinone, catechol, and hindered phenol developers.

9. The positive-acting photosensitive element according to claim 8 wherein said reducing agent for silver ion has the general formula:

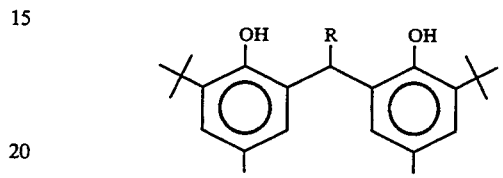

wherein:

R is a member selected from the group consisting of hydrogen and alkyl groups of up to 5 carbon atoms.

10. The positive-acting photosensitive element according to claim 1 wherein said toner is selected from the group consisting of phthalazinone, phthalazine, and phthalic acid.

11. A method of generating a positive image comprising:

(a) providing a positive-acting photosensitive element comprising a support having at least a first layer and a second layer on one surface thereof, which first and second layers define a non-photosensitive, heat-developable medium and a photosensitive photocurable medium; said non-photosensitive heat developable medium consisting essentially of a non-photosensitive reducible silver source, and a reducing system comprising a reducing agent for silver ion and toner, such that said first layer comprises said non-photosensitive reducible silver source and said photosensitive photocurable medium and said second layer comprises said reducing system; wherein exposure of said positive-acting photosensitive element to actinic radiation causes curing of said photosensitive photocurable medium in the exposed areas, said curing preventing said reducing agent for silver ion and/or said toner of said reducing system from interacting with said non-photosensitive reducible silver source during thermal processing and in which said photosensitive photocurable medium consists essentially of a free radical curable resin and a photoinitiator therefor which is a combination of an oxonol dye and an onium salt having an absorbance to radiation in the wavelength range of 340 to 440 nm, which photoinitiator upon exposure to said actinic radiation or during subsequent thermal processing undergoes a loss of absorption in said wavelength range 340–440 nm;

(b) imagewise exposing said photosensitive element; and (c) heating the exposed element to a temperature from 90° to 150° C. for a period of from 5 to 60 seconds develop the image.

12. A positive-acting photosensitive element comprising a support having at least a first layer, a second layer, and a third layer on one surface thereof, which first, second, and third layers define a non-photosensitive, heat-developable medium and a photosensitive photocurable medium; said non-photosensitive heat-developable medium consisting essentially of a non-photosensitive reducible silver source, and a reducing system comprising a reducing agent for silver ion and toner, such that said first layer comprises said non-photosensitive reducible silver source, said second layer comprising said photocurable medium, and third layer comprising said reducing system; wherein exposure of said positive-acting photosensitive element to actinic radiation causes curing of said photosensitive photocurable medium in the exposed areas, said curing preventing said reducing system from interacting with said non-photosensitive reducible silver source during thermal processing and in which said photosensitive photocurable medium consists essentially of a free radical curable resin and a photoinitiator therefor which is a combination of an oxonol due and an onium salt having an absorbance to radiation in the wavelength range of 340 to 440 nm, which photoinitiator upon exposure to said actinic radiation or during subsequent thermal processing undergoes a loss of absorption in said wavelength range 340–440 nm.

13. The positive-acting photosensitive element according to claim 12 in which said second layer comprises a microdispersion of said photocurable medium in said second layer.

14. A method of generating a positive image comprising:

(a) providing a positive-acting photosensitive element comprising a support having at least a first layer, a second layer, and a third layer on one surface thereof, which first, second, and third layers define a non-photosensitive, heat-developable medium and a photosensitive photocurable medium; said non-photosensitive heat developable medium consisting essentially of a non-photosensitive reducible silver source, and a reducing system comprising a reducing agent for silver ion and toner, such that said first layer comprises said non-photosensitive reducible silver source, said second layer comprises said photocurable medium, and said third layer comprises said reducing system wherein exposure of said positive-acting photosensitive element to actinic radiation causes curing of said photosensitive photocurable medium in the exposed areas, said curing preventing said reducing agent for silver ion and/or said toner of said reducing system from interacting with said non-photosensitive reducible silver source during thermal processing and in which said photosensitive photocurable medium consists essentially of a free radical curable resin and a photoinitiator therefor which is a combination of an oxonol dye and an onium salt having an absorbance to radiation in the wavelength range of 340 to 440 nm, which photoinitiator upon exposure to said actinic radiation or during subsequent thermal processing undergoes a loss of absorption in said wavelength range 340–440 nm;

(b) imagewise exposing said photosensitive element; and (c) heating the exposed element to a temperature from 90° to 150° C. for a period of from 5 to 60 seconds develop the image.

* * * * *